United States Patent
Chen et al.

(10) Patent No.: US 10,938,422 B2
(45) Date of Patent: Mar. 2, 2021

(54) POLAR CODE RATE MATCHING METHOD AND APPARATUS, AND A COMMUNICATIONS APPARATUS

(71) Applicant: HUAWEI TECHNOLOGIES CO., LTD., Guangdong (CN)

(72) Inventors: Ying Chen, Hangzhou (CN); Hejia Luo, Hangzhou (CN); Huazi Zhang, Hangzhou (CN); Gongzheng Zhang, Hangzhou (CN); Rong Li, Hangzhou (CN); Yue Zhou, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/579,334

(22) Filed: Sep. 23, 2019

(65) Prior Publication Data

US 2020/0021315 A1   Jan. 16, 2020

Related U.S. Application Data

(63) Continuation of application No. PCT/CN2018/080072, filed on Mar. 22, 2018.

(30) Foreign Application Priority Data

Mar. 24, 2017   (CN) .................. 201710182082.X

(51) Int. Cl.
*H03M 13/00*   (2006.01)
*H03M 13/13*   (2006.01)

(52) U.S. Cl.
CPC ....... *H03M 13/6368* (2013.01); *H03M 13/13* (2013.01)

(58) Field of Classification Search
None
See application file for complete search history.

(56) References Cited

U.S. PATENT DOCUMENTS

2013/0117344 A1*   5/2013   Gross .............. H03M 13/1575
                                                      708/490
2014/0365842 A1*   12/2014  Li .................. H03M 13/1111
                                                      714/752
(Continued)

FOREIGN PATENT DOCUMENTS

CN   103023618 A   4/2013
CN   103281166 A   9/2013
(Continued)

OTHER PUBLICATIONS

Huawei et al: "Pol ar code design and rate matching"_3GPP Draft; R1-167209, Aug. 13, 2016,XP051142532, total 6 pages.
(Continued)

*Primary Examiner* — Mujtaba M Chaudry
(74) *Attorney, Agent, or Firm* — Womble Bond Dickinson (US) LLP

(57) ABSTRACT

Embodiments of this application provide a polar code rate matching method and apparatus, and a communications apparatus. The rate matching method includes: determining N to-be-encoded bits, where the N to-be-encoded bits include N1 information bits, and both N1 and N are positive integers; encoding the N to-be-encoded bits to obtain N encoded bits; obtaining a first puncturing sequence based on an information bit length N1, the quantity N of the encoded bits, and a quantity Q of to-be-punctured bits; and performing a puncturing operation on the N encoded bits based on the first puncturing sequence to implement a rate matching. To-be-punctured bits indicated in the first puncturing sequence are obtained based on the information bit length N1, the quantity N of the encoded bits, and the quantity Q of the to-be-punctured bits, and are not generated randomly.

19 Claims, 6 Drawing Sheets

(56) References Cited

U.S. PATENT DOCUMENTS

| | | | |
|---|---|---|---|
| 2015/0026543 A1* | 1/2015 | Li | H03M 13/45 |
| | | | 714/776 |
| 2015/0293716 A1* | 10/2015 | Jiang | G06F 11/1012 |
| | | | 711/154 |
| 2015/0295593 A1* | 10/2015 | Trifonov | H03M 13/13 |
| | | | 714/776 |
| 2016/0013810 A1* | 1/2016 | Gross | H03M 13/13 |
| | | | 714/776 |
| 2016/0182187 A1* | 6/2016 | Kim | H04L 1/1861 |
| | | | 714/807 |
| 2017/0005753 A1 | 1/2017 | Shen et al. | |
| 2017/0019214 A1 | 1/2017 | Shen et al. | |
| 2017/0149531 A1* | 5/2017 | Raza | H03M 13/37 |

FOREIGN PATENT DOCUMENTS

| | | |
|---|---|---|
| WO | 2015139248 A1 | 9/2015 |
| WO | 2015149225 A1 | 10/2015 |

OTHER PUBLICATIONS

Mostafa El-Khamy et al: "HARQ Rate-Compatible Polar Codes for Wireless Channels",Jan. 2014, XP055397700,total 6 pages.

Anonymous:"Bit-reversal permutation—Wikipedia",Dec. 11, 2014,XP055664950 ,total 4 pages.

NTT DOCOMO:"Discussion on construction of Polar codes",3GPP Draft;R1-1702850,Feb. 12, 2017, XP051209995,total 10 pages.

\* cited by examiner

330

330

POLAR CODE RATE MATCHING METHOD AND APPARATUS, AND A COMMUNICATIONS APPARATUS

CROSS-REFERENCE TO RELATED APPLICATIONS

This application is a continuation of International Application No. PCT/CN2018/080072, filed on Mar. 22, 2018, which claims priority to Chinese Patent Application No. 201710182082.X, filed on Mar. 24, 2017. The disclosures of the aforementioned applications are herein incorporated by reference in their entireties.

TECHNICAL FIELD

Embodiments of this application relate to the communications field, and more specifically, to a polar code rate matching method and apparatus, and a communications apparatus.

BACKGROUND

Channel coding is usually used in a communications system to improve data transmission reliability, so as to ensure communication quality. Polar codes proposed by Turkish professor Arikan are the first desirable codes that have been theoretically proved to be able to achieve a Shannon capacity and that have low encoding and decoding complexity. A polar code is a linear block code, and its encoding matrix is $G_N$. For example, a polar encoding process is indicated as $x_1^N = u_1^N G_N$, where $u_1^N = (u_1, u_2, K, u_N)$ is a binary row vector, a length of $u_1^N$ is N (that is, a mother code length); $G_N$ is an N×N matrix, and $G_N = F_2^{\otimes (log_2(N))}$. $F_2^{\otimes (log_2(N))}$ is defined as a Kronecker product of $log_2$ N matrices $F_2$.

The foregoing matrix $$F_2 = \begin{bmatrix} 1 & 0 \\ 1 & 1 \end{bmatrix}.$$

In a polar encoding process, some bits $u_1^N$ are used to carry information and are referred to as information bits, and a set of indexes of these bits is denoted as A; and the other bits $u_1^N$ are set to fixed values that are pre-agreed on by a receive end and a transmit end and are referred to as fixed bits or frozen bits, and a set of indexes of these bits is denoted as a complementary set $A^c$ of A. The polar encoding process is equivalently indicated as $x_1^N = u_A G_N(A) \oplus u_{A^c} G_N(A^c)$ Herein, $G_N(A)$ is a sub-matrix formed by rows, corresponding to the indexes in the set A, in $G_N$, and $G_N(A^c)$ is a sub-matrix formed by rows, corresponding to the indexes in the set $A^C$, in $G_N$. $u_A$ is a set of the information bits in $u_1^N$, a quantity of the information bits is K, $u_{A^c}$ is a set of the fixed bits in $u_1^N$, a quantity of the fixed bits is (N−K), and the fixed bits are known bits. These fixed bits are usually set to 0s, but a fixed bit may be set randomly provided that the receive end and the transmit end have a pre-agreement. When the fixed bits are set to 0s, an encoding output of the polar code may be simplified as $x_1^N = u_A G_N(A)$, where $G_N(A)$ is a K×N matrix.

A construction process of the polar code is a selection process of the set A, and determines polar code performance. The construction process of the polar code usually includes: determining, based on a mother code length N, that there are a total of N polarized channels that are respectively corresponding to N rows of the encoding matrix; calculating reliability of the polarized channels; and using indexes of the first K polarized channels with higher reliability as elements of the set A, and using indexes of the rest (N−K) polarized channels as elements of the index set $A^c$ of the fixed bits. The set A determines positions of the information bits, and the set $A^c$ determines positions of the fixed bits.

It may be seen from the encoding matrix that, a code length of an original polar code (mother code) is an integral power of 2. In actual application, rate matching usually needs to be performed to obtain a polar code with any code length, and a puncturing (puncture) manner may usually be used to implement rate matching.

In the prior art, conventional random puncturing may be used, that is, a position in which puncturing needs to be performed is randomly determined. For example, a mother code length of a polar code is 16, a quantity of positions in which puncturing needs to be performed is 6. In this case, six puncturing positions are selected randomly from 16 positions. Implementing rate matching in the random puncturing manner reduces polar code performance.

SUMMARY

Embodiments of this application provide a polar code rate matching method and apparatus, and a communications apparatus, so as to improve polar code performance.

According to a first aspect, a polar code rate matching method is provided, including:

determining N to-be-encoded bits, where the N to-be-encoded bits include N1 information bits, and both N1 and N are positive integers; encoding the N to-be-encoded bits to obtain N encoded bits; obtaining a first puncturing sequence based on an information bit length N1, the quantity N of the encoded bits, and a quantity Q of to-be-punctured bits; and performing puncturing on the N encoded bits based on the first puncturing sequence to implement rate matching.

In one embodiment, the determining N to-be-encoded bits includes:

determining N based on M, where $N = 2^{\lfloor log_2(M-1) \rfloor + 1}$, the symbol $\lfloor \rfloor$ represents a rounding-down operation, M is an output target code length of a polar code, M is not equal to a positive integer power of 2, M is a positive integer, and the quantity of to-be-punctured bits is Q=N−M.

In one embodiment, the obtaining a first puncturing sequence based on an information bit length N1, the quantity N of the encoded bits, and a quantity Q of to-be-punctured bits includes:

obtaining a second puncturing sequence corresponding to the information bit length N1 and the quantity N of the encoded bits, where a length of the second puncturing sequence is (N/2)−1; and determining the first puncturing sequence from the second puncturing sequence based on the quantity Q of to-be-punctured bits.

In one embodiment, the obtaining a second puncturing sequence corresponding to the information bit length N1 and the quantity N of the encoded bits includes:

obtaining the second puncturing sequence from a puncturing sequence in an appendix table 1 or an equivalent replacement sequence of the puncturing sequence in the table 1.

In one embodiment, the determining the first puncturing sequence from the second puncturing sequence based on the quantity Q of to-be-punctured bits includes:

determining a sequence including the first Q to-be-punctured bits in the second puncturing sequence, as the first puncturing sequence.

In one embodiment, the obtaining a first puncturing sequence based on an information bit length N1, the quantity N of the encoded bits, and a quantity Q of to-be-punctured bits includes:

obtaining a third puncturing sequence corresponding to the information bit length N1 and a maximum mother code length, where the maximum mother code length is a mother code length corresponding to a maximum target code length supported by a communications system to which the polar code is applied; and determining the first puncturing sequence from the third puncturing sequence based on the quantity N of the encoded bits and the quantity Q of to-be-punctured bits.

In one embodiment, the obtaining a third puncturing sequence corresponding to the information bit length N1 and a maximum mother code length includes:

obtaining the third puncturing sequence from a puncturing sequence in an appendix table 2 or an equivalent replacement sequence of the puncturing sequence in the table 2.

In one embodiment, the determining the first puncturing sequence from the third puncturing sequence based on the quantity N of the encoded bits and the quantity Q of to-be-punctured bits includes:

successively reading, starting from the first to-be-punctured bit in the third puncturing sequence, to-be-punctured bits that are not greater than N; and when a quantity of read to-be-punctured bits reaches the quantity Q of to-be-punctured bits, determining a sequence including the read Q to-be-punctured bits as the first puncturing sequence.

In one embodiment, the obtaining a first puncturing sequence based on an information bit length N1, the quantity N of the encoded bits, and a quantity Q of to-be-punctured bits includes:

determining the first to-be-punctured bit from the N encoded bits based on the N1 information bits; and separately determining, by traversing i values from 2 to the quantity Q of to-be-punctured bits, the $i^{th}$ to-be-punctured bit from (N−i+1) encoded bits remaining after determined (i−1) to-be-punctured bits are excluded from the N encoded bits, where 2≤i≤Q; and using a sequence including the determined Q to-be-punctured bits as the first puncturing sequence.

In one embodiment, where the determining the first to-be-punctured bit from the N encoded bits based on the N1 information bits includes:

when each of the N encoded bits is used as a to-be-punctured bit, separately calculating an error probability of polarized channels corresponding to the N1 information bits; and determining a minimum error probability from the calculated N error probabilities, and determining an encoded bit corresponding to the minimum error probability as the first to-be-punctured bit.

In one embodiment, the determining the $i^{th}$ to-be-punctured bit from (N−i+1) encoded bits remaining after determined (i−1) to-be-punctured bits are excluded from the N encoded bits includes:

when each of the (N−i+1) encoded bits is used as a to-be-punctured bit, separately calculating an error probability of polarized channels corresponding to the N1 information bits; and determining a minimum error probability from the calculated (N−i+1) error probabilities, and determining an encoded bit corresponding to the minimum error probability as the $i^{th}$ to-be-punctured bit.

In one embodiment, the calculating an error probability of polarized channels corresponding to the N1 information bits includes:

adding up error probabilities of the polarized channels corresponding to all of the N1 information bits to obtain the error probability of the polarized channels corresponding to the N1 information bits.

According to a second aspect, a polar code rate matching apparatus is provided, including:

a determining module, configured to determine N to-be-encoded bits, where the N to-be-encoded bits include N1 information bits, and both N1 and N are positive integers; an encoding module, configured to encode the N to-be-encoded bits to obtain N encoded bits; a first-puncturing-sequence obtaining module, configured to obtain a first puncturing sequence based on an information bit length N1, the quantity N of the encoded bits, and a quantity Q of to-be-punctured bits; and a puncturing module, configured to perform puncturing on the N encoded bits based on the first puncturing sequence to implement rate matching.

In one embodiment, the determining module is specifically configured to:

determine n based on m, where $n=2^{\lfloor log_2(M-1) \rfloor +1}$, the symbol $\lfloor \rfloor$ represents a rounding-down operation, M is an output target code length of a polar code, M is not equal to a positive integer power of 2, M is a positive integer, and the quantity of to-be-punctured bits is Q=N−M.

In one embodiment, the first-puncturing-sequence obtaining module includes:

a second-puncturing-sequence obtaining module, configured to obtain a second puncturing sequence corresponding to the information bit length N1 and the quantity N of the encoded bits, where a length of the second puncturing sequence is (N/2)−1; and a first-puncturing-sequence determining module, configured to determine the first puncturing sequence from the second puncturing sequence based on the quantity Q of to-be-punctured bits.

In one embodiment, the second-puncturing-sequence obtaining module is specifically configured to:

obtain the second puncturing sequence from a puncturing sequence in an appendix table 1 or an equivalent replacement sequence of the puncturing sequence in the table 1.

In a possible implementation, the first-puncturing-sequence determining module is specifically configured to:

determine a sequence including the first Q to-be-punctured bits in the second puncturing sequence, as the first puncturing sequence.

In one embodiment, the first-puncturing-sequence obtaining module includes:

a third-puncturing-sequence obtaining module, configured to obtain a third puncturing sequence corresponding to the information bit length N1 and a maximum mother code length, where the maximum mother code length is a mother code length corresponding to a maximum target code length supported by a communications system to which the polar code is applied; and a first-puncturing-sequence determining module, configured to determine the first puncturing sequence from the third puncturing sequence based on the quantity N of the encoded bits and the quantity Q of to-be-punctured bits.

In one embodiment, the third-puncturing-sequence obtaining module is specifically configured to:

obtain the third puncturing sequence from a puncturing sequence in an appendix table 2 or an equivalent replacement sequence of the puncturing sequence in the table 2.

In a possible implementation, the first-puncturing-sequence determining module is specifically configured to:

successively read, starting from the first to-be-punctured bit in the third puncturing sequence, to-be-punctured bits that are not greater than N; and when a quantity of read to-be-punctured bits reaches the quantity Q of to-be-punctured bits, determine a sequence including the read Q to-be-punctured bits as the first puncturing sequence.

In a possible implementation, the first-puncturing-sequence obtaining module is specifically configured to:

determine the first to-be-punctured bit from the N encoded bits based on the N1 information bits; and separately determine, by traversing i values from 2 to the quantity Q of to-be-punctured bits, the $i^{th}$ to-be-punctured bit from (N−i+1) encoded bits remaining after determined (i−1) to-be-punctured bits are excluded from the N encoded bits, where $2 \leq i \leq Q$; and use a sequence including the determined Q to-be-punctured bits as the first puncturing sequence.

According to a third aspect, a communications apparatus is provided, including:

a memory, configured to store a program; and a processor, configured to execute the program stored in the memory, and when the program is executed, the processor is configured to perform the method in any one of the first aspect or the possible implementations of the first aspect.

Another aspect of this application provides a computer-readable storage medium, where the computer-readable storage medium stores an instruction, and when the instruction runs on a computer, the computer is enabled to perform the method in the foregoing aspects.

Another aspect of this application provides a computer program product including an instruction, where when the instruction runs on a computer, the computer is enabled to perform the method in the foregoing aspects.

Another aspect of this application provides a computer program, where when the computer program runs on a computer, the computer is enabled to perform the method in the foregoing aspects.

In the embodiments of this application, the to-be-punctured bits indicated in the first puncturing sequence are obtained based on the information bit length N1, the quantity N of the encoded bits, and the quantity Q of to-be-punctured bits, and are not generated randomly. Therefore, a polar code performance can be improved.

DESCRIPTION OF EMBODIMENTS

Figure 1:
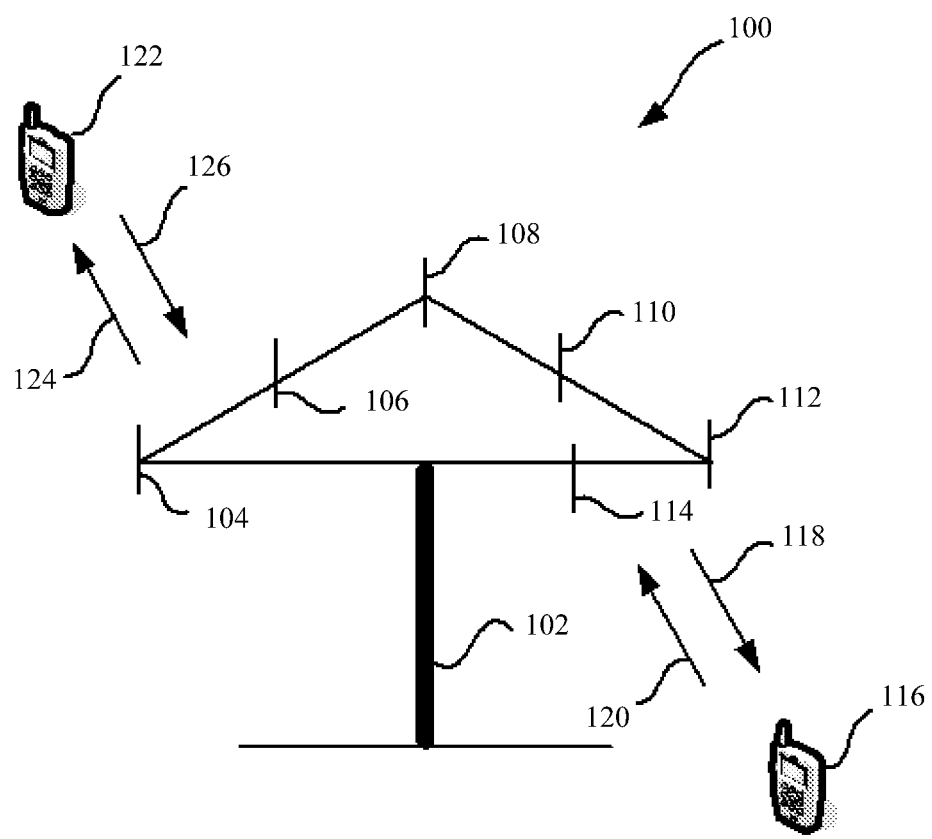
FIG. 1 shows a structure of a wireless communications system according to one embodiment of this application.

The embodiments of this application may be applied to various communications systems, and therefore the following description is not limited to a specific communications system. A global system for mobile communications (GSM) system, a code division multiple access (CDMA) system, a wideband code division multiple access (WCDMA) system, a general packet radio service (General Packet Radio Service, "GPRS" for short) system, a long term evolution (LTE) system, an LTE frequency division duplex (Frequency Division Duplex, "FDD" for short) system, an LTE time division duplex (TDD) system, a universal mobile telecommunications system (UMTS), or the like. Polar coding in the embodiments can be used for all information or data that can be processed through conventional turbo coding or LDPC coding by a base station or a terminal in the foregoing system.

Terms such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both an application that runs on a computing device and a computing device may be components. One or more components may reside within a process and/or a thread of execution, and a component may be located on one computer and/or distributed between two or more computers. In addition, these components may be executed from various computer-readable media that store various data structures. The components may perform communication by using a local and/or remote process and based on, for example, a signal having one or more data packets (for example, data from two components interacting with another component in a local system, a distributed system, and/or across a network such as the Internet interacting with other systems by using the signal).

In addition, the embodiments are described with reference to an access terminal. The access terminal may also be referred to as a system, a subscriber unit, a subscriber station, a mobile station, a mobile console, a remote station, a remote terminal, a mobile device, a user terminal, a terminal, a wireless communications device, a user agent, a user apparatus, or UE (user equipment). The access terminal may be a cellular phone, a cordless phone, a SIP (session initiation protocol) phone, a WLL (wireless local loop) station, a PDA (personal digital assistant), a handheld device with a wireless communication function, a computing device, or another processing device connected to a wireless modem. In addition, the embodiments are described with reference to a base station. The base station can be used for communicating with a mobile device, and the base station may be a BTS (Base Transceiver Station, base transceiver station) in a GSM (global system for mobile communications) system or in a CDMA (code division multiple access) system; or may be an NB (NodeB) in a WCDMA (wideband code division multiple access) system; or may be an eNB or eNodeB (evolved NodeB) in an LTE (long term evolution)

system, a relay station, an access point, a base station device in a future 5G network, or the like.

FIG. 1 shows a wireless communications system 100 according to the embodiments described in this specification. The system 100 includes a base station 102, and the base station 102 may include a plurality of antenna groups. For example, one antenna group may include antennas 104 and 106, another antenna group may include antennas 108 and 110, and an additional group may include antennas 112 and 114. For each antenna group, two antennas are shown. However, more or less antennas may be used in each group. The base station 102 may additionally include a transmitter chain and a receiver chain. A person of ordinary skill in the art may understand that both the transmitter chain and the receiver chain may include a plurality of components related to signal transmission and reception (for example, a processor, a modulator, a multiplexer, a demodulator, a demultiplexer, or an antenna).

The base station 102 may communicate with one or more access terminals (for example, an access terminal 116 and an access terminal 122). However, it may be understood that the base station 102 may communicate with basically any quantity of access terminals similar to the access terminals 116 and 122. The access terminals 116 and 122 may be, for example, cellular phones, smartphones, portable computers, handheld communications devices, handheld computing devices, satellite radio apparatuses, global positioning systems, PDAs, and/or any other appropriate devices that are configured to perform communication in the wireless communications system 100. As shown in the figure, the access terminal 116 communicates with the antennas 112 and 114. The antennas 112 and 114 send information to the access terminal 116 through a forward link 118, and receive information from the access terminal 116 through a reverse link 120. In addition, the access terminal 122 communicates with the antennas 104 and 106. The antennas 104 and 106 send information to the access terminal 122 through a forward link 124, and receive information from the access terminal 122 through a reverse link 126. For example, in an FDD (frequency division duplex) system, for example, a frequency band used for the forward link 118 may be different from that used on the reverse link 120, and a frequency band used for the forward link 124 may be different from that used on the reverse link 126. In addition, in a TDD (time division duplex) system, a frequency band used for the forward link 118 may be the same as that used on the reverse link 120, and a frequency band used for the forward link 124 may be the same as that used on the reverse link 126.

Each antenna group and/or area designed for communication are/is referred to as a sector of the base station 102. For example, an antenna group may be designed to communicate with an access terminal in a sector of a coverage area of the base station 102. During communication through the forward links 118 and 124, transmit antennas of the base station 102 may increase signal-to-noise ratios of the forward links 118 and 124 for the access terminals 116 and 122 through beamforming. In addition, compared with a manner in which a base station uses a single antenna to send information to all access terminals served by the base station, when the base station 102 sends, through beamforming, information to the access terminals 116 and 122 that are distributed randomly in the related coverage area, a mobile device in a neighboring cell receives less interference.

Within a given time, the access terminal 116, and/or the access terminal 122 may be a wireless communications sending apparatus and/or a wireless communications receiving apparatus. When sending data, the wireless communications sending apparatus may encode the data for transmission. Specifically, the wireless communications sending apparatus may have (for example, generate, obtain, or store in a memory), a specific quantity of information bits to be sent to the wireless communications receiving apparatus through a channel. Such information bits may be included in a data transport block (or a plurality of transport blocks), and the transport block may be segmented to generate a plurality of code blocks. In addition, the wireless communications sending apparatus may use a polar code encoder (which is not shown) to encode each code block.

Figure 2A:
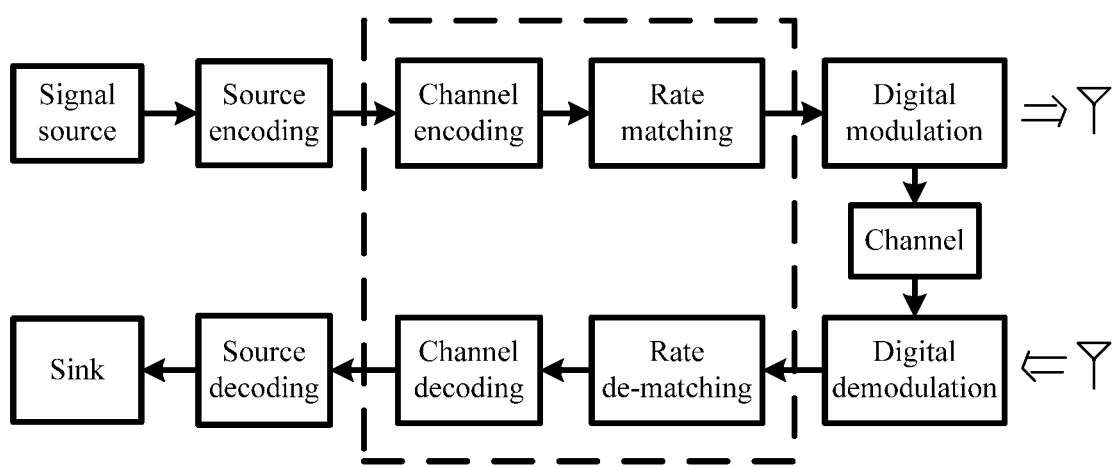
FIG. 2a is a basic schematic flowchart of a transmit end and a receive end in wireless communication according to one embodiment of this application.

FIG. 2a shows a basic flowchart of wireless communication. At a transmit end, a signal source is sent after having successively undergone source encoding, channel encoding, and digital modulation. At a receive end, after having successively undergone digital demodulation, channel decoding, and source decoding, a processed signal source is output to a sink. A polar code may be used for channel encoding and decoding. Because a code length of an original polar code (mother code) is an integral power of 2, in actual application, rate matching needs to be performed to obtain a polar code with any code length. As shown in FIG. 2a, at the transmit end, rate matching is performed after channel encoding to obtain any target code length; and at the receive end, rate de-matching is performed before channel decoding.

Figure 2B:
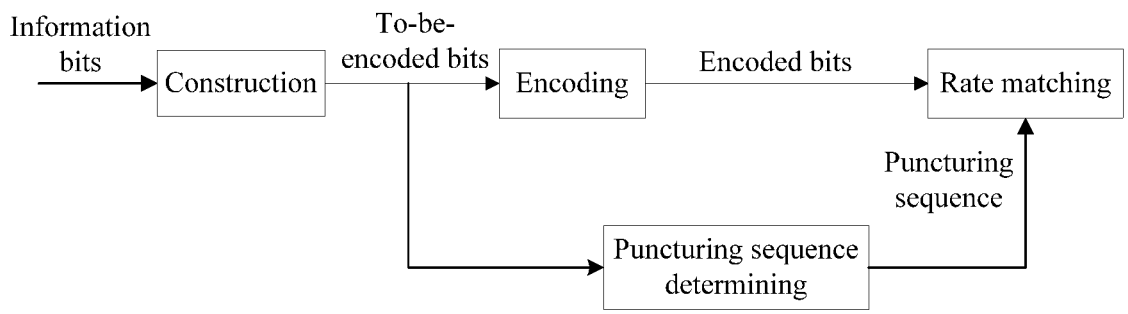
FIG. 2b is a schematic diagram of a polar encoding and rate matching process in an embodiment of this application.

FIG. 2b is a schematic diagram of a polar encoding and rate matching process according to an embodiment of this application. It can be seen from FIG. 2b that, polar encoding and rate matching mainly includes four processing processes: construction, encoding, puncturing sequence determining, and rate matching.

Construction process: Input N1 information bits are received, and a mother code length N is determined, where the mother code length N is determined based on a target code length M obtained after rate matching, a quantity of to-be-encoded bits is N, the N to-be-encoded bits includes N1 information bits and N2 fixed bits, and one bit (an information bit or a fixed bit) corresponds to one polarized channel. Positions of the N1 information bits form an information bit position set, and positions of the N2 fixed bits form a fixed-bit position set. The information bit position set may be specifically a set of indexes of the information bits, and a manner of determining the information bit position set is not limited in this application. For example, a position of an information bit may be determined based on reliability of a polarized channel. Specifically, reliability of a polarized channel is estimated based on an actual parameter and a code rate of the polarized channel, and an information bit is set in a position corresponding to a polarized channel with high reliability, or a position of an information bit may be determined based on a polarization weight of a polarized channel.

Encoding process: Polar encoding is performed on the to-be-encoded bits to obtain encoded bits.

Puncturing sequence determining: A puncturing sequence is determined, where the puncturing sequence is a set of to-be-punctured bits and is used to indicate puncturing positions, and a quantity of elements included in the puncturing sequence is a quantity of to-be-punctured bits.

Rate matching: Puncturing is performed on the encoded bits based on the determined puncturing sequence to implement rate matching. Specifically, some encoded bits are selected from the encoded bits according to the determined puncturing sequence, and are directly discarded without being transmitted through a channel, so as to be adapted to the target code length to adjust an encoding code rate.

Figure 3:
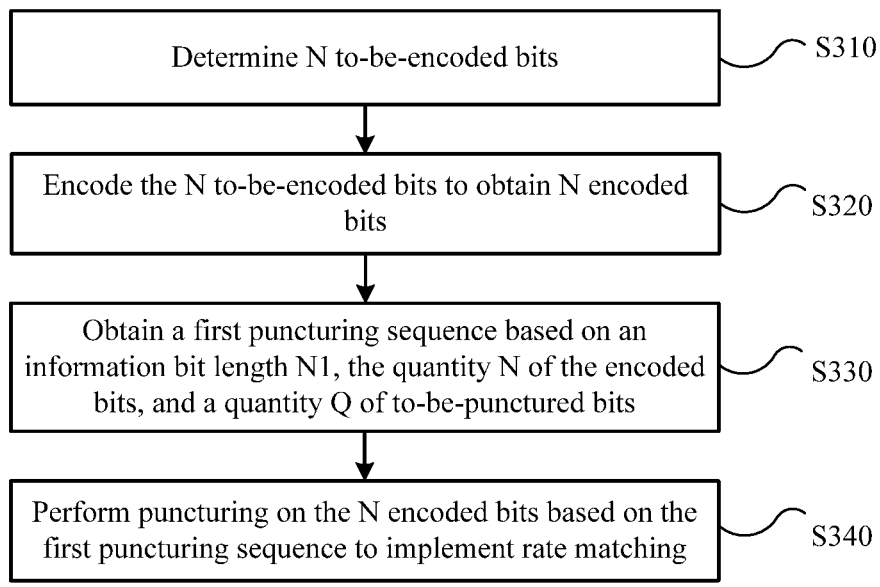
FIG. 3 is a schematic flowchart of a polar code rate matching method in an embodiment of this application.

FIG. 3 shows a polar code rate matching method 300 according to an embodiment of this application. Specifically, the rate matching method 300 includes the following operations.

S310: Determine N to-be-encoded bits.

The N to-be-encoded bits include N1 information bits, and both N1 and N are positive integers.

Specifically, N is determined based on an output target code length M of a polar code, where $N=2^{\lfloor log_2(M-1) \rfloor+1}$, the symbol $\lfloor \ \rfloor$ represents a rounding-down operation, M is not equal to a positive integer power of 2, M is a positive integer, the N to-be-encoded bits correspond to N polarized channel, and one bit corresponds to one polarized channel.

A puncturing manner is used to implement rate matching, and a quantity of to-be-punctured bits is Q=N−M.

It should be noted that, in this embodiment of this application, the information bits may include only information bits, or may be bits with a specific function relationship with the information bits, or may include information bits and check bits, and the check bit may be a CRC bit or a parity check bit.

S320: Encode the N to-be-encoded bits to obtain N encoded bits.

Specifically, an encoding matrix $F_N$ of the polar code may be used to complete an encoding process of the to-be-encoded bits, so as to obtain the encoded bits after polar encoding.

S330: Obtain a first puncturing sequence based on an information bit length N1, the quantity N of the encoded bits, and a quantity Q of to-be-punctured bits.

Figure 4:
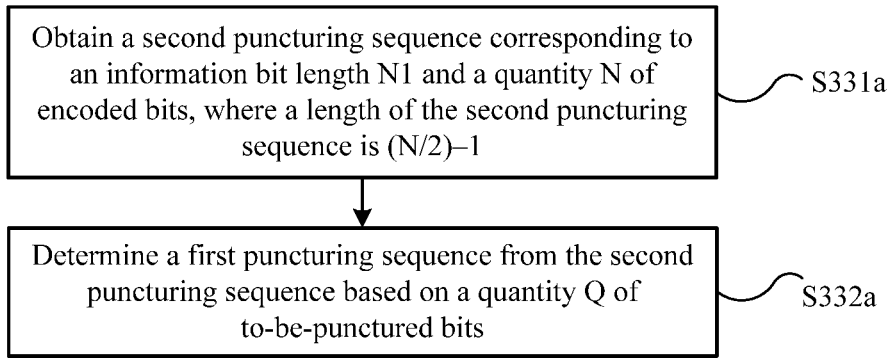
FIG. 4 is a flowchart of an implementation of operation 330 in FIG. 3.
Figure 5:
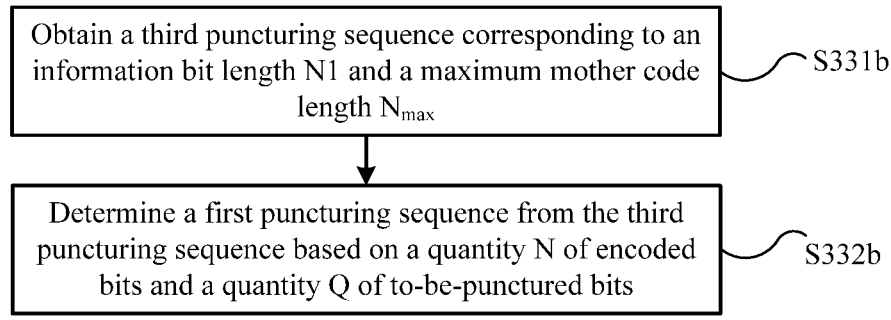
FIG. 5 is a flowchart of another implementation of operation 330 in FIG. 3.
Figure 6:
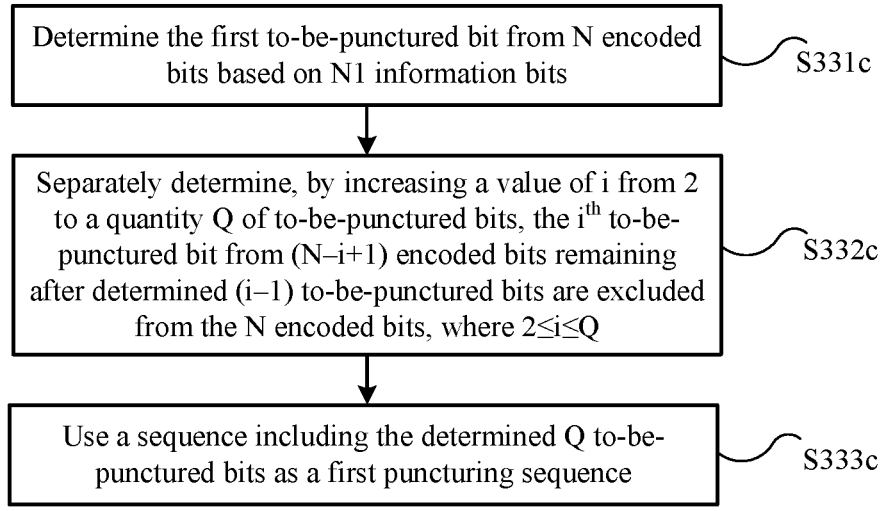
FIG. 6 is a flowchart of another implementation of operation 330 in FIG. 3.

Specifically, the following provides three specific implementations with reference to FIG. 4, FIG. 5, and FIG. 6.

The information bit length means a quantity of the information bits. When the information bits include an information bit and a check bit, the information bit length means a sum of a quantity of the information bits and a quantity of the check bits; and the quantity N of the encoded bits is a mother code length N.

5340: Perform puncturing on the N encoded bits based on the first puncturing sequence to implement rate matching.

Specifically, some encoded bits are selected from the encoded bits based on to-be-punctured bits indicated in the first puncturing sequence, and are directly discarded without being transmitted through a channel, so as to be adapted to the target code length to adjust an encoding code rate.

The following provides three specific implementations of S330 with reference to FIG. 4, FIG. 5, and FIG. 6.

As shown in FIG. 4, in an embodiment of this application, S330 of obtaining a first puncturing sequence based on an information bit length N1, the quantity N of the encoded bits, and a quantity Q of to-be-punctured bits includes the following operations.

S331a: Obtain a second puncturing sequence corresponding to the information bit length N1 and the quantity N of the encoded bits, where a length of the second puncturing sequence is (N/2)−1.

Specifically, an appendix table 1 provides second puncturing sequences corresponding to different values of the information bit length N1 and different values of the quantity N of the encoded bits. For example, when the information bit length is N1=54, the quantity of the encoded bits (the mother code length) is N=128, the table 1 provides three possible second puncturing sequences. When the information bit length is N1=54, the quantity of the encoded bits (the mother code length) is N=256, the table 1 also provides three possible second puncturing sequences. It should be noted that, the information bit length N1 may also be equal to a replacement value of 54, and the replacement value of 54 indicates that the information bit length N1 may be a value close to 54. For example, the replacement value of 54 may be a value in an interval [49, 59], or a value in an interval [44, 64].

Therefore, the second puncturing sequence may be obtained through query of a puncturing sequence in the table 1 or an equivalent replacement sequence of the puncturing sequence in the table 1. An element in the puncturing sequence in the table 1 is used to indicate a sequence number of a polarized channel, all or a part of the puncturing sequences in the table 1 may be stored in a communications system to which this implementation is applied.

It should be noted that, the table 1 and a table 2 in the following are only examples, and adjustment or equivalent replacement made to the puncturing sequences in the table 1 and the table 2 without affecting an overall effect of the table 1 and the table 2 may include but not be limited to the following several aspects.

1. Positions of a few elements in the puncturing sequences in the table 1 and table 2 are interchanged. For example, positions of two adjacent elements in a puncturing sequence are interchanged, or positions of two elements with an interval of not greater than 10 elements in a puncturing sequence are interchanged.

2. Elements included in puncturing sequences in the table 1 and the table 2 are used to indicate sequence numbers of polarized channels. It can be learned from the table 1 and the table 2 that, the sequence numbers of the polarized channels start from 1, and actually, the sequence numbers of the polarized channels may alternatively start from 0. Therefore, 1 is subtracted from each element in the puncturing sequences in the current appendix table 1 and table 2 to form the sequence numbers, starting from 0, of the polarized channels. Certainly, another manner may be used to indicate the foregoing sequence numbers or identifiers of the polarized channels, the specific representation manner does not affect specific positions of the polarized channels indicated in the tables.

3. Elements in the puncturing sequences in the table 1 and the table 2 can be in a reverse order.

S332a: Determine the first puncturing sequence from the second puncturing sequence based on the quantity Q of to-be-punctured bits.

Specifically, Q to-be-punctured bits are selected from the second puncturing sequence as the first puncturing sequence. For example, a sequence including the first Q to-be-punctured bits in the second puncturing sequence is determined as the first puncturing sequence, or a sequence including the last Q to-be-punctured bits in the second puncturing sequence is determined as the first puncturing sequence. How to select Q to-be-punctured bits from the second puncturing sequence as the first puncturing sequence is not specifically limited in this embodiment.

It can be learned from the embodiment corresponding to FIG. 4 that, computing complexity during construction of the first puncturing sequence can be reduced through storage of the second puncturing sequences in the communications system.

As shown in FIG. 5, in another embodiment of this application, S330 of obtaining a first puncturing sequence based on an information bit length N1, the quantity N of the encoded bits, and a quantity Q of to-be-punctured bits includes the following operations.

S331b: Obtain a third puncturing sequence corresponding to the information bit length N1 and a maximum mother code length $N_{max}$.

The maximum mother code length $N_{max}$ is a mother code length corresponding to a maximum target code length supported by the communications system to which the polar code is applied, a length of the third puncturing sequence is $N_{max}-1$, and the third puncturing sequence is a maximum puncturing sequence corresponding to the maximum mother code length $N_{max}$.

Specifically, the appendix table 2 provides third puncturing sequences corresponding to different values of the information bit length N1 and different values of the maximum mother code length $N_{max}$. For example, when the information bit length is N1=54, the maximum mother code length is $N_{max}$=1024, the table 2 provides three possible third puncturing sequences. It should be noted that, the information bit length N1 may be equal to a replacement value of 54, and the replacement value of 54 indicates that the information bit length N1 may be a value close to 54. For example, the replacement value of 54 may be a value in an interval [49, 59], or a value in an interval [44, 64].

Therefore, the third puncturing sequence may be obtained through query of a puncturing sequence in the table 2 or an equivalent replacement sequence of the puncturing sequence in the table 2. An element in the puncturing sequence in the table 2 is used to indicate a sequence number of a polarized channel, all or a part of the puncturing sequences in the table 2 may be stored in the communications system to which this implementation is applied.

That the puncturing sequence in the table 2 can be used for equivalent replacement is described above, and details are not described herein again.

S332b: Determine the first puncturing sequence from the third puncturing sequence based on the quantity N of the encoded bits and the quantity Q of to-be-punctured bits.

Specifically, to-be-punctured bits that are not greater than N are successively read starting from the first to-be-punctured bit in the third puncturing sequence; and when a quantity of read to-be-punctured bits reaches the quantity Q of to-be-punctured bits, a sequence including the read Q to-be-punctured bits is determined as the first puncturing sequence.

Obviously, alternatively, to-be-punctured bits that are not greater than N may be successively read starting from the last to-be-punctured bit in the third puncturing sequence. Reading is performed starting from which element in the third puncturing sequence is not limited in this embodiment.

It can be learned from the embodiment corresponding to FIG. 5 that, computing complexity during construction of the first puncturing sequence can be reduced through storage of the third puncturing sequences in the communications system.

As shown in FIG. 6, in another embodiment of this application, S330 of obtaining a first puncturing sequence based on an information bit length N1, the quantity N of the encoded bits, and a quantity Q of to-be-punctured bits includes the following operations.

S331c: Determine the first to-be-punctured bit from the N encoded bits based on the N1 information bits.

Specifically, when each bit in the N encoded bits is used as a to-be-punctured bit, an error probability of polarized channels corresponding to the N1 information bits is separately calculated; and a minimum error probability is determined from the calculated N error probabilities, and an encoded bit corresponding to the minimum error probability is determined as the first to-be-punctured bit.

The calculating an error probability of polarized channels corresponding to the N1 information bits includes:

adding up error probabilities of the polarized channels corresponding to all of the N1 information bits to obtain the error probability of the polarized channels corresponding to the N1 information bits.

It should be noted that, the error probability of polarized channels corresponding to the information bits can be calculated by using a method such as a density evolution method or a Gaussian approximation method. How to calculate the error probability of the polarized channels is not specifically limited in this embodiment.

S332c: Separately determine, by traversing i values from 2 to the quantity Q of to-be-punctured bits, the $i^{th}$ to-be-punctured bit from (N−i+1) encoded bits remaining after determined (i−1) to-be-punctured bits are excluded from the N encoded bits, where 2≤i≤Q.

Specifically, the determining the $i^{th}$ to-be-punctured bit from (N−i+1) encoded bits remaining after determined (i−1) to-be-punctured bits are excluded from the N encoded bits includes:

when each of the (N−i+1) encoded bits is used as a to-be-punctured bit, separately calculating an error probability of polarized channels corresponding to the N1 information bits; and determining a minimum error probability from the calculated (N−i+1) error probabilities, and determining an encoded bit corresponding to the minimum error probability as the $i^{th}$ to-be-punctured bit.

The calculating an error probability of polarized channels corresponding to the N1 information bits includes:

adding up error probabilities of the polarized channels corresponding to all of the N1 information bits to obtain the error probability of the polarized channels corresponding to the N1 information bits.

For example, when i=2, it indicates that a second round of determining a puncturing position is performed. In this case, determining the second puncturing position from positions of (N−1) encoded bits remaining after one puncturing position is excluded from positions of the N encoded bits includes:

when each of the (N−1) encoded bits is used as a to-be-punctured bit, calculating an error probability of polarized channels corresponding to the N1 information bits; and determining a minimum error probability from the calculated (N−1) error probabilities, and determining an encoded bit corresponding to the minimum error probability as the second to-be-punctured bit.

S333c: Use a sequence including the determined Q to-be-punctured bits as the first puncturing sequence.

It can be learned from the embodiment corresponding to FIG. 6, the first puncturing sequence is determined through online calculation with no needs to store a puncturing sequence in the communications system, so as to save a storage resource.

In the rate matching method provided in this application, the to-be-punctured bits indicated in the first puncturing sequence are obtained based on the information bit length N1, the quantity N of the encoded bits, and the quantity Q of to-be-punctured bits, and are not generated randomly. Therefore, polar code performance can be improved.

Figure 7:
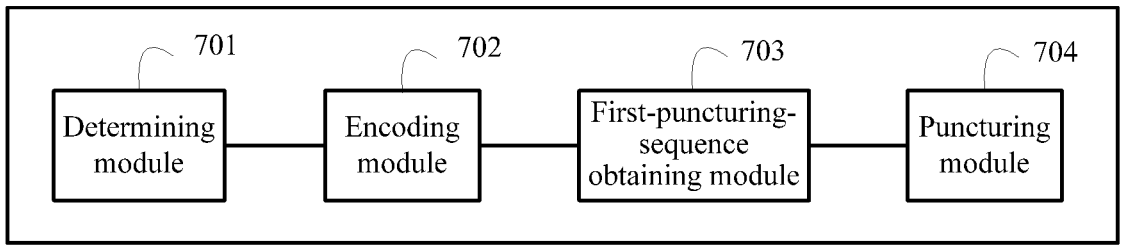
FIG. 7 is a structural diagram of a polar code rate matching apparatus in an embodiment of this application.

With reference to FIG. 7, the following describes a polar code rate matching apparatus 700 provided in an embodiment of this application. The rate matching apparatus 700 includes a determining module 701, an encoding module 702, a first-puncturing-sequence obtaining module 703, and a puncturing module 704.

The determining module 701 is configured to determine N to-be-encoded bits, where the N to-be-encoded bits include N1 information bits, and both N1 and N are positive integers.

Specifically, the determining module 701 is configured to determine N based on M, where $N=2^{\lfloor log_2(M-1) \rfloor+1}$, the symbol ⌊ ⌋ represents a rounding-down operation, M is an output target code length of a polar code, M is not equal to a positive integer power of 2, M is a positive integer, and a quantity of to-be-punctured bits is $Q=N-M$.

The encoding module 702 is configured to encode the N to-be-encoded bits to obtain N encoded bits.

Specifically, an encoding matrix $F_N$ of the polar code may be used to complete an encoding process of the to-be-encoded bits, so as to obtain the encoded bits after polar encoding.

The first-puncturing-sequence obtaining module 703 is configured to obtain a first puncturing sequence based on an information bit length N1, the quantity N of the encoded bits, and the quantity Q of to-be-punctured bits.

The puncturing module 704 is configured to perform puncturing on the N encoded bits based on the first puncturing sequence to implement rate matching.

Figure 8:
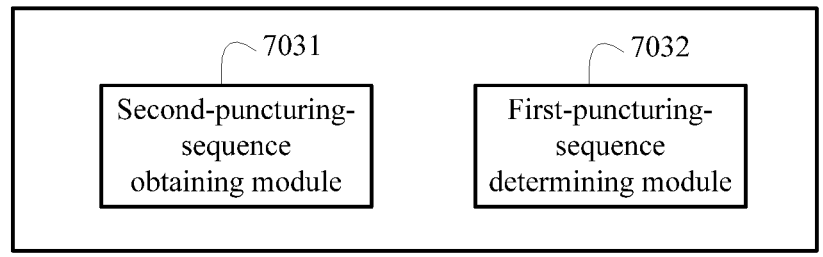
FIG. 8 is a structural diagram of a module 703 in FIG. 7 in an embodiment of this application.

In an embodiment of this application, as shown in FIG. 8, the first-puncturing-sequence obtaining module 703 includes a second-puncturing-sequence obtaining module 7031 and a first-puncturing-sequence determining module 7032.

The second-puncturing-sequence obtaining module 7031 is configured to obtain a second puncturing sequence corresponding to the information bit length N1 and the quantity N of the encoded bits, where a length of the second puncturing sequence is (N/2)−1.

The first-puncturing-sequence determining module 7032 is configured to determine the first puncturing sequence from the second puncturing sequence based on the quantity Q of to-be-punctured bits.

Specifically, the second-puncturing-sequence obtaining module 7031 may obtain the second puncturing sequence from a puncturing sequence in an appendix table 1 or an equivalent replacement sequence of the puncturing sequence in the table 1; and the first-puncturing-sequence determining module 7032 may determine a sequence including the first Q to-be-punctured bits in the second puncturing sequence, as the first puncturing sequence.

Figure 9:
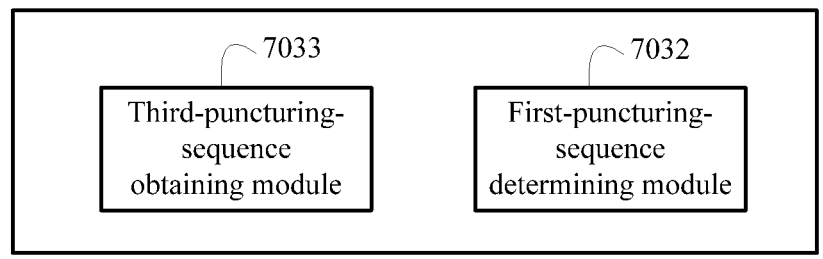
FIG. 9 is another structural diagram of the module 703 in FIG. 7 in an embodiment of this application.

In another embodiment of this application, as shown in FIG. 9, the first-puncturing-sequence obtaining module 703 includes a third-puncturing-sequence obtaining module 7033 and the first-puncturing-sequence determining module 7032.

The third-puncturing-sequence obtaining module 7033 is configured to obtain a third puncturing sequence corresponding to the information bit length N1 and a maximum mother code length, where the maximum mother code length is a mother code length corresponding to a maximum target code length supported by a communications system to which the polar code is applied.

The first-puncturing-sequence determining module 7032 is configured to determine the first puncturing sequence from the third puncturing sequence based on the quantity N of the encoded bits and the quantity Q of to-be punctured bits.

Specifically, the third-puncturing-sequence obtaining module 7033 may obtain the third puncturing sequence from a puncturing sequence in an appendix table 2 or an equivalent replacement sequence of the puncturing sequence in the table 2; and the first-puncturing-sequence determining module 7032 is specifically configured to: successively read, starting from the first to-be-punctured bit in the third puncturing sequence, to-be-punctured bits that are not greater than N; and when a quantity of read to-be-punctured bits reaches the quantity Q of to-be-punctured bits, determine a sequence including the read Q to-be-punctured bits as the first puncturing sequence.

In another embodiment of this application, the first-puncturing-sequence obtaining module 703 is specifically configured to: determine the first to-be-punctured bit from the N encoded bits based on the N1 information bits; separately determine, by traversing i values from 2 to the quantity Q of to-be-punctured bits, the $i^{th}$ to-be-punctured bit from (N−i+1) encoded bits remaining after determined (i−1) to-be-punctured bits are excluded from the N encoded bits, where $2 \leq i \leq Q$; and use a sequence including the determined Q to-be-punctured bits as the first puncturing sequence.

The determining the first to-be-punctured bit from the N encoded bits based on the N1 information bits includes: when each of the N encoded bits is used as a to-be-punctured bit, separately calculating an error probability of polarized channels corresponding to the N1 information bits; and determining a minimum error probability from the calculated N error probabilities, and determining an encoded bit corresponding to the minimum error probability as the first to-be-punctured bit.

The determining the $i^{th}$ to-be-punctured bit from (N−i+1) encoded bits remaining after determined (i−1) to-be-punctured bits are excluded from the N encoded bits includes: when each of the (N−i+1) encoded bits is used as a to-be-punctured bit, separately calculating an error probability of polarized channels corresponding to the N1 information bits; and determining a minimum error probability from the calculated (N−i+1) error probabilities, and determining an encoded bit corresponding to the minimum error probability as the $i^{th}$ to-be-punctured bit.

Further, the calculating an error probability of polarized channels corresponding to the N1 information bits includes: adding up error probabilities of the polarized channels corresponding to all of the N1 information bits to obtain the error probability of the polarized channels corresponding to the N1 information bits.

In the rate matching apparatus provided in this embodiment of this application, the to-be-punctured bits indicated in the first puncturing sequence are obtained based on the information bit length N1, the quantity N of the encoded bits, and the quantity Q of to-be-punctured bits, and are not generated randomly. Therefore, a polar code performance can be improved.

Figure 10:
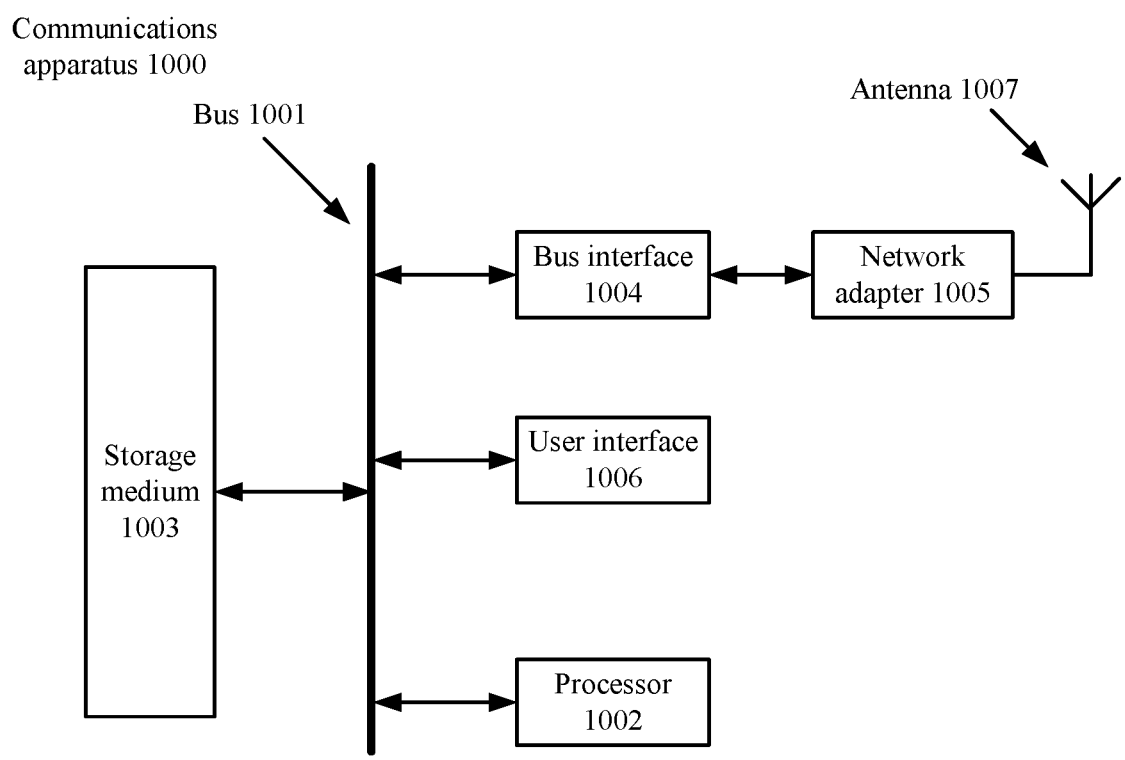
FIG. 10 is a structural diagram of a communications apparatus in an embodiment of this application.

FIG. 10 is a schematic structural diagram of a communications apparatus 1000 according to an embodiment of this application (for example, a communications apparatus such as an access point, a base station, a station, or a terminal; or a chip in the foregoing communications apparatus).

As shown in FIG. 10, the communications apparatus 1000 may be implemented by using a bus 1001 as a general bus architecture. Based on a specific application and an overall design constraint of the communications apparatus 1000, the bus 1001 may include any quantity of interconnection buses and bridges. The bus 1001 connects various circuits together, and the circuits include a processor 1002, a storage medium 1003, and a bus interface 1004. In one embodiment, the communications apparatus 1000 uses the bus interface 1004 to connect a network adapter 1005 and the like through the bus 1001. The network adapter 1005 may be configured to implement a signal processing function of a physical layer in a wireless communications network, and implement sending and receiving of a radio frequency signal through an antenna 1007. A user interface 1006 may be connected to a user terminal such as a keyboard, a display, a mouse, or a joystick. The bus 1001 may be further connected to various other circuits, such as a timing source, a peripheral device, a voltage regulator, or a power management circuit. The circuits are well known in the art, and therefore details are not described herein.

Alternatively, the communications apparatus 1000 may be configured as a general-purpose processing system. For example, the general-purpose processing system may be generally referred to as a chip. The general-purpose processing system includes one or more microprocessors providing a processor function, and an external memory providing at least one part of the storage medium 1003; and all these are connected to another support circuit through an external bus architecture.

Alternatively, the communications apparatus 1000 may be implemented through the following: an ASIC (application-specific integrated circuit) with the processor 1002, the bus interface 1004, and the user interface 1006 and at least one part of the storage medium 1003 integrated into a single chip; or the communications apparatus 1000 may be implemented through the following: one or more FPGAs (field-programmable gate array), a PLD (programmable logic device), a controller, a state machine, gate logic, a discrete hardware component, any other suitable circuit, or any combination of circuits implementing various functions described in this application.

The processor 1002 is responsible for bus management and general processing (including executing software stored in the storage medium 1003). The processor 1002 may be implemented through one or more general-purpose processors and/or one or more special-purpose processors. For example, the processor includes a microprocessor, a microcontroller, a DSP processor, and another circuit that can execute software. The software should be broadly explained as indicating an instruction, data, or any combination thereof, regardless of that it is referred as software, firmware, middleware, microcode, hardware description language, and the like.

As shown in the following figure, the storage medium 1003 is separated from the processor 1002. However, a person skilled in the art easily understands that, the storage medium 1003 and any part thereof may be located outside the communications apparatus 1000. For example, the storage medium 1003 may include a transmission line, a carrier waveform modulated by using data, and/or a computer product separated from a wireless node, and all the media may be accessed by the processor 1002 through the bus interface 1004. Alternatively, the storage medium 1003 and any part thereof may be integrated into the processor 1002. For example, the storage medium 1003 may be a cache and/or a general register.

The processor 1002 may implement the foregoing embodiments, for example, the embodiments successively corresponding to FIG. 3, FIG. 4, FIG. 5, and FIG. 6, and an implementation process of the processor 1002 is not described herein.

The communications apparatus described in the embodiments of this application may be a wireless communications device such as an access point, a station, a base station, or a user terminal.

The polar code described in the embodiments of this application includes but is not limited to an Arikan polar code, or may be a CA-polar code or a PC-polar code. The Arikan polar code is an original polar code, is not concatenated with other code, and includes only an information bit and a frozen bit. The CA-polar code is a polar code obtained by concatenating a polar code with a cyclic redundancy check (CRC) code, and the PC-polar code is a code obtained by concatenating a polar code with a parity check (PC) code. The PC-polar code and the CA-polar code improve polar code performance through concatenating different codes.

The fixed bits described in the embodiments of this application may also be referred to as frozen bits. In the examples described in the embodiments of this application, units and method processes may be implemented by electronic hardware or a combination of computer software and electronic hardware. Whether the functions are performed by hardware or software depends on particular applications and design constraints of the technical solutions. A person skilled in the art can implement the described functions by using different methods for each specific application.

In the several embodiments provided in this application, it should be understood that the disclosed apparatus and method may be implemented in other manners. For example, the described apparatus embodiments are merely examples. For example, the module division is merely logical function division and may be other division in actual implementation. For example, a plurality of modules or units may be combined or integrated into another system, or some operations may be ignored or not performed. In addition, coupling, direct coupling, or a communication connection between the modules or units may be implemented through some interfaces, and these may be in an electrical form, a mechanical form, or another form.

The unit described as a separate component may be or not be separate physically, and may be disposed in one position, or may be distributed to a plurality of network units.

In addition, functional units in the embodiments of this application may be integrated into one processing unit, or each of the units may exist alone physically, or two or more units are integrated into one unit.

All or some of the foregoing embodiments may be implemented through software, hardware, firmware, or any combination thereof. When software is used to implement the embodiments, the embodiments may be implemented completely or partially in a form of a computer program product. The computer program product includes one or more computer instructions. When the computer program instructions are loaded and executed on a computer, the procedure or functions according to the embodiments of this application are all or partially generated. The computer may be a general-purpose computer, a special-purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave) manner. The computer-readable storage medium may be any usable medium accessible by a computer, or a data storage device, such as a server or a data center integrating one or more usable media. The usable medium may be a magnetic medium (for example, a floppy disk, a hard disk, or a magnetic tape), an optical medium (for example, a DVD), a semiconductor medium (for example, Solid State Disk (SSD)), or the like.

APPENDIX

TABLE 1

Information bit length: N1 = 54 or a replacement value of 54; quantity of encoded bits (mother code length): N = 128; and second puncturing sequence:

(1 3 2 4 5 7 6 8 9 11 10 12 13 15 70 40
34 16 33 35 38 102 32 69 27 26 21 71 36 29 85 44
25 66 31 98 23 77 93 48 43 14 68 17 30 91 55 24
41 18 100 47 50 81 28 65 49 88 42 79 20 90 39)
or
(1 3 2 4 5 7 6 8 33 11 34 36 15 13 14 16
35 65 97 10 37 12 45 27 26 44 23 22 24 71 87 48
31 30 67 99 21 43 75 107 91 19 83 40 38 29 42 32
68 39 103 18 86 17 46 72 56 66 47 85 20 61 104)
or
(1 65 33 97 3 67 7 71 2 4 6 8 5 69 18 22
20 24 35 99 21 10 70 12 26 23 16 28 32 9 85 25
11 37 101 53 117 27 17 81 49 113 41 14 68 57 72 15
66 34 98 31 43 75 107 19 46 83 51 115 44 13 52)

Information bit length: N1 = 54 or a replacement value of 54; Quantity of encoded bits (mother code length): N = 256; and second puncturing sequence:

(1 2 3 4 5 6 7 8 9 10 11 20 22 21 23 24
18 17 19 12 25 26 27 28 13 14 29 30 39 40 135 167
56 34 36 33 50 49 52 37 16 32 53 35 131 163 38 54
42 58 41 57 44 60 45 61 134 166 48 96 75 91 55 136
168 65 81 73 89 151 183 78 94 68 84 76 92 133 165 66
82 74 90 139 203 51 77 93 164 69 132 197 46 62 70 161
86 173 64 80 141 72 205 88 162 101 229 109 237 147 179 15
31 138 85 202 79 95 180 112 128 129 120 130 104 169 67)
or
(1 33 2 34 5 37 6 38 3 35 4 36 7 39 8 40
9 10 41 14 13 42 45 46 11 12 43 16 15 44 47 48
65 66 97 73 105 74 98 106 69 70 77 78 101 109 102 110
19 20 71 24 31 28 32 27 63 52 56 103 51 60 64 59
18 22 79 26 30 129 161 21 29 68 76 72 80 137 169 50
54 193 225 201 233 23 58 62 53 17 61 131 84 163 92 152
25 120 175 83 96 159 191 75 164 49 115 146 86 94 133 114
165 90 168 132 89 143 91 150 111 214 158 222 116 149 117)
or
(1 2 3 4 5 6 7 8 9 10 11 12 133 22 16 15
37 14 20 19 17 130 165 24 34 23 33 28 30 27 162 25
32 41 31 38 36 35 13 84 26 39 46 29 86 83 40 135
81 136 43 44 89 62 167 92 91 168 65 70 73 42 67 68
163 52 49 90 75 166 97 113 48 47 134 102 198 230 141 96
63 18 57 140 59 82 88 105 121 87 144 66 131 112 157 54
194 98 226 21 118 150 182 214 246 79 138 95 108 171 106 170
234 74 202 53 64 55 146 210 154 218 45 72 50 114 178)

TABLE 2

Information bit length: N1 = 54 or a replacement value of 54; Maximum mother code length: $N_{max}$ = 1024; and third puncturing sequence:

(1 65 2 66 3 67 4 68 257 321 258 322 7 71 8 72
5 69 6 70 261 325 262 326 259 323 260 324 263 327 264 328
9 73 10 74 11 75 12 76 13 77 14 78 15 79 16 80
265 329 266 330 269 333 270 334 43 44 107 108 271 335 272 336
33 34 97 98 267 331 268 332 37 38 39 40 101 102 103 104
35 36 41 42 99 100 105 106 45 46 47 48 109 110 111 112
289 290 293 294 291 292 295 296 353 354 357 302 299 300 303 304
297 298 301 358 361 362 365 366 355 356 359 360 363 364 367 368
17 18 81 82 19 83 20 84 21 85 22 86 23 87 24 88
49 50 113 114 51 52 115 116 53 54 117 118 55 56 119 120
25 89 26 90 27 91 28 92 29 93 30 94 31 95 144 208
60 57 124 121 58 59 122 123 62 61 126 125 400 464 63 127
276 340 273 337 136 200 277 341 146 210 147 211 278 214 279 143
207 284 348 281 217 286 222 285 221 168 232 215 282 218 283 219
176 240 185 249 178 242 317 253 180 244 179 243 182 246 183 247
316 309 252 245 318 305 254 241 314 187 250 251 392 456 399 463
432 496 137 201 132 196 287 130 194 223 141 205 310 374 275 339
152 216 191 184 133 197 248 350 158 255 315 379 380 188 129 193
346 154 311 375 164 228 169 233 162 226 307 371 342 150 173 237

TABLE 2-continued 382 347 155 148 212 190 343 151 32 96 373 181 378 186 369 177
64 128 175 239 274 338 313 377 444 508 349 157 406 470 131 195
306 370 288 407 471 352 411 475 414 478 145 209 308 372 381 189
320 163 227 256 410 474 345 153 156 220 319 383 134 198 149 213
280 344 351 159 166 230 387 451 312 376 545 225 386 450 549 229
388 452 567 759 570 506 523 587 446 510 540 476 393 457 525 461
658 722 805 660 671 468 479 801 664 472 485 646 481 710 659 467
544 224 681 489 526 171 235 590 826 429 493 676 674 431 740 495
796 482 823 665 384 192 729 675 678 486 483 631 634 413 477 692
434 703 604 779 498 511 756 645 438 709 502 203 552 513 488 449
558 691 800 238 755 441 505 736 445 890 765 524 887 440 504 698
683 588 491 750 405 469 174 527 514 591 769 516 578 439 704 437
757 512 580 699 507 142 846 521 577 522 585 390 781 172 236 543
582 515 530 579 808 447 594 519 165 140 204 537 586 601 398 583
206 589 616 459 613 428 833 139 546 492 607 641 534 448 640 547
562 559 404 598 553 596 501 569 695 503 554 536 951 1015 234 531
557 600 430 555 435 548 565 550 396 595 480 657 460 623 610 619
465 520 621 566 778 433 622 575 160 497 564 517 626 611 614 509
528 735 556 617 202 655 687 484 592 533 490 568 443 542 635 415
606 541 572 719 161 627 170 628 751 560 831 959 630 584 539 402
633 466 574 573 799 927 783 911 535 815 943 639 767 847 975 863
991 879 895 1007 1023 599 791 855 138 458 395 668 427 529 426 563
620 499 581 656 715 670 561 728 403 732 597 747 394 605 734 720
723 422 673 408 775 603 532 663 727 593 662 419 714 771 612 649
416 713 839 795 462 835 652 629 642 891 424 637 726 420 739 816
824 693 700 571 436 701 654 809 731 442 762 551 609 684 954 1018
807 919 702 787 454 851 661 797 576 745 648 643 865 409 694 707
644 853 494 697 682 811 875 473 716 518 733 651 500 784 848 761
803 712 860 412 819 690 615 425 873 867 696 738 947 798 862 705
385 744 915 742 789 725 843 829 748 893 231 883 792 920 836 743
828 793 680 952 936 857 827 763 625 897 961 487 776 859 667 904
618 777 905 937 825 953 979 724 921 780 167 856 907 841 971 908
956 423 871 985 812 924 940 679 669 821 896 737 988 899 538 969
772 708 785 844 939 861 804 984 135 885 876 391 721 636 868 963
764 706 889 900 417 923 666 685 972 955 717 840 925 932 817 802
987 788 746 917 931 820 968 749 957 916 948 845 973 892 981 753
650 842 935 813 941 401 912 995 632 647 849 906 976 1003 970 1001
794 760 397 929 810 1004 882 653 624 938 913 773 852 754 818 884
989 689 922 199 455 711 881 946 880 964 602 688 944 903 1010 730
877 786 872 949 983 389 901 967 945 850 888 977 858 993 886 768
1011 980 837 1024 909 996 814 914 926 874 999 1009 990 752 1012 830
1005 1000 638 958 766 986 832 453 770 898 894 741 686 942 834 774
838 672 878 806 870 421 718 902 677 790 869 854 866 933 965 997
992 608 864 928 1019 960 934 1013 966 1008 918 994 962 978 1017
1016 1002 1022 974 1006 782 418 758 822 910 930 998 1020 1021 950 982)
or
(1 2 3 4 257 258 259 260 5 6 7 8 261 262 263 264
9 10 11 12 13 14 15 16 265 266 267 268 269 270 271 272
33 34 35 36 37 38 39 40 41 42 43 44 45 46 47 48
289 290 291 292 293 294 295 296 297 298 299 300 301 302 303 304
17 18 19 20 21 22 23 24 73 74 75 28 77 30 31 32
273 274 275 276 277 278 279 56 105 106 63 284 109 286 107 64
49 50 51 280 53 287 54 52 55 288 25 62 331 60 29 26
115 305 114 116 309 119 120 58 127 57 124 118 61 128 27 126
83 82 65 84 281 92 59 282 285 86 87 88 69 94 95 96
97 307 306 308 101 122 311 312 121 316 79 310 125 80 283 78
111 112 110 89 123 72 81 70 67 90 93 68 71 76 85 66
99 104 313 98 320 113 103 314 319 100 317 102 108 117 318 91
315 322 321 324 323 330 329 204 198 197 199 200 334 333 207 208
230 229 231 236 226 225 367 232 234 233 227 368 235 238 237 228
214 213 215 216 348 209 210 211 340 345 218 219 221 224 223 222
245 248 374 247 241 252 254 243 370 253 256 379 378 255 249 244
134 325 327 136 129 142 131 332 130 335 336 141 346 139 132 137
360 355 162 337 359 166 148 341 349 350 155 156 351 138 377 352
344 151 161 342 338 147 165 164 366 363 365 172 170 361 175 384
369 182 376 179 373 180 375 178 381 380 383 186 153 382 187 176
133 326 356 339 353 364 135 146 169 328 347 362 144 157 158 143
357 196 358 371 189 354 167 168 202 193 240 251 201 190 140 239
372 343 194 145 154 159 185 188 387 398 397 472 149 150 160 171
177 212 183 242 409 412 191 634 501 512 630 395 558 173 568 163
886 192 814 217 391 386 385 890 399 220 565 589 388 195 587 152
402 206 403 393 528 824 401 646 407 396 543 645 404 845 650 411
674 419 672 405 417 548 679 670 425 556 431 406 843 669 434 648
435 666 433 560 439 677 436 569 678 444 703 446 424 699 445 682
821 578 451 708 705 455 812 429 784 463 761 438 664 462 683 442
611 740 481 610 473 615 799 732 474 725 470 448 747 494 749 760
467 594 593 468 599 457 714 508 751 816 454 709 478 712 475 541
627 500 754 489 849 759 460 746 511 744 797 486 741 510 804 763

TABLE 2-continued 480 825 753 867 428 855 706 479 656 509 518 523 414 517 522 850
499 520 540 513 487 521 527 538 416 532 205 526 539 534 469 536
572 482 515 537 497 519 544 447 557 542 516 651 390 597 554 184
531 545 498 553 559 250 796 567 496 776 685 654 443 564 549 662
415 524 625 643 394 576 477 647 626 777 644 550 389 574 571 492
641 552 655 410 573 738 464 659 788 665 695 174 629 792 555 566
495 588 529 423 622 612 547 181 624 514 490 639 525 440 617 667
694 636 421 535 702 609 680 466 563 427 692 633 570 422 701 640
591 418 583 533 590 420 623 785 618 653 450 604 580 675 505 757
582 750 584 711 476 832 603 673 488 698 681 819 432 731 546 621
836 700 575 426 642 661 493 684 838 846 551 586 687 823 437 616
773 752 882 461 774 710 782 892 868 718 458 768 840 951 592 767
413 530 657 940 745 769 743 720 408 602 779 562 755 506 858 818
808 872 608 736 697 400 798 690 719 772 828 452 764 848 860 901
668 900 964 780 504 924 988 956 716 1020 620 844 748 652 876 908
972 1004 484 676 932 996 820 628 884 907 739 1016 598 925 721 880
827 726 596 852 392 456 671 606 809 803 734 790 913 800 691 854
737 862 793 756 864 937 904 968 730 794 577 430 635 883 948 781
789 658 896 717 600 856 853 922 507 936 931 770 920 834 637 607
775 778 735 1000 921 1012 246 839 842 585 897 502 660 783 898 833
713 632 911 802 962 866 930 696 927 722 994 786 891 888 595 453
813 914 912 581 877 724 903 663 822 976 946 765 885 909 829 941
893 693 986 485 917 949 728 805 826 910 762 973 933 613 837 918
869 1008 806 965 758 950 981 873 934 916 449 810 952 801 865 874
926 688 978 605 928 841 878 203 961 957 954 733 982 847 863 997
1001 902 969 975 906 991 686 441 974 889 861 704 815 879 649 614
631 960 953 943 942 992 870 831 959 742 465 967 938 944 929 970
807 989 1002 871 980 1005 601 857 727 966 729 895 985 984 947 1010
830 1013 935 503 851 998 905 1011 723 787 1007 881 915 483 887
715
638 795 771 859 471 561 923 579 811 707 766 894 958 817 1009 689
990 459 945 791 919 1006 983 1018 1024 977 1021 999 955 987
1014 993 1015 979 995 899 835 491 963 1017 1019 1022 1023
619 875 939 971)
or
(1 257 2 258 17 273 18 274 33 289 34 290 49 305 50 306
3 259 4 260 19 275 20 276 35 291 36 292 51 307 52 308
5 261 6 262 21 277 22 278 37 293 38 294 53 309 54 310
7 263 8 264 23 279 24 280 39 295 40 296 55 311 56 312
129 161 385 417 130 162 386 132 418 164 388 420 131 163 387 419
133 165 389 421 134 166 390 422 135 167 136 168 391 423 392 424
81 337 82 338 177 178 433 434 83 84 339 340 179 180 435 436
85 86 87 88 117 182 342 183 343 184 344 439 438 341 440 373
13 269 10 29 285 14 12 45 301 16 26 61 317 30 28 32
9 266 282 11 15 42 298 25 58 314 27 71 41 46 57 151
44 48 327 407 60 64 103 119 359 375 62 268 284 265 281 300
316 297 313 270 43 286 59 302 318 69 72 101 199 231 272 288
215 247 455 487 471 503 304 320 66 77 93 76 92 73 70 89
80 267 96 283 299 74 315 90 78 94 109 125 108 124 105 121
112 128 333 349 365 381 146 110 126 68 325 106 122 357 332 348
65 364 380 145 75 150 171 91 152 329 345 98 402 361 377 100
102 187 104 406 97 408 31 148 330 346 401 113 321 353 369 362
378 47 404 147 63 118 326 271 120 287 200 303 319 232 230 246
149 181 376 328 139 360 405 437 336 352 368 384 155 114 427 322
226 370 443 216 248 456 488 472 504 79 95 395 193 225 334 350
209 241 366 382 411 449 481 465 497 194 111 354 127 210 242 335
351 116 450 482 466 498 367 383 67 196 228 141 173 244 99 142
174 107 123 140 172 157 189 143 158 190 324 211 356 372 212 397
429 413 445 452 484 468 500 115 195 398 430 175 414 446 227 399
431 243 138 170 137 358 374 169 331 347 198 363 379 144 176 197
229 214 323 403 394 426 355 371 213 396 428 245 538 453 485 469
501 794 186 543 540 454 486 470 502 537 519 551 535 567 647 679
791 695 775 807 903 935 823 663 919 951 583 599 615 631 839 855
743 887 871 711 727 759 967 999 983 1015 160 192 188 400 432 416
448 444 185 220 799 250 591 847 202 234 201 204 556 233 796 206
575 831 623 879 208 238 607 863 240 542 574 224 576 217 684 716
249 670 702 205 221 698 649 154 639 895 252 704 544 237 527 783
559 815 462 494 707 739 666 464 560 800 253 832 816 528 681 672
960 928 496 656 256 784 688 480 512 912 944 592 608 624 640 848
864 880 896 720 752 736 768 976 1008 992 1024 203 697 555 603 153
717 251 733 714 715 506 490 683 713 749 509 793 745 595 798 830
755 207 239 463 495 526 655 687 911 943 719 751 975 1007 159 191
415 447 223 479 703 959 671 927 255 511 735 767 991 1023 859 619
635 926 958 558 875 851 782 522 523 686 570 891 554 732 515 826
410 547 778 810 922 764 761 563 517 533 579 442 611 524 521 606
549 565 654 814 254 910 942 766 862 590 222 622 510 846 478 878
1022 638 718 734 750 894 974 990 1006 812 652 516 548 531 627 532
564 539 587 514 771 803 513 546 529 787 819 525 835 483 723 499
541 729 867 451 883 659 643 675 467 691 899 931 915 947 963 995
979 1011 557 573 553 545 561 441 520 776 581 518 774 597 777 589

TABLE 2-continued 477 534 790 577 593 536 792 409 677 550 693 571 806 425 530 569
493 562 779 637 156 552 808 843 668 801 625 566 822 645 235 642
789 568 572 709 674 824 491 725 644 676 585 473 827 658 601 457
690 700 785 769 811 660 582 613 747 692 689 489 584 633 678 838
505 617 650 682 833 795 646 902 393 841 825 934 889 218 651 730
712 588 741 849 459 629 648 840 665 905 763 954 710 578 969 857
706 904 580 757 753 219 809 966 921 680 602 907 708 609 773 594
817 881 475 968 661 802 865 596 873 971 586 938 906 985 598 618
805 854 657 850 821 614 507 858 694 721 950 781 746 913 901 770
870 933 699 834 458 977 662 797 918 634 917 937 885 762 667 898
953 630 621 886 474 829 731 949 641 890 962 939 877 705 853 742
653 945 842 909 874 1005 923 724 897 837 726 461 936 616 869 930
685 772 836 900 673 964 970 758 786 737 600 1001 612 955 740 965
610 813 669 856 845 925 744 738 987 914 804 929 664 982 932 920
961 986 788 605 852 981 993 1003 866 998 872 861 728 460 818 1002
628 941 756 722 997 780 844 868 916 696 701 604 476 1009 626 636
820 632 412 860 924 828 508 620 765 893 754 882 957 760 888 946
952 989 884 948 1013 1017 984 973 980 978 1018 1014 1019
908 994 1000 988 892 996 956 236 492 1010 1012 1016 1020
1021 748 876 940 972)

The invention claimed is:

1. A polar code rate matching method, comprising:
   determining N to-be-encoded bits, wherein the N to-be-encoded bits comprise N1 information bits, and both N1 and N are positive integers;
   encoding the N to-be-encoded bits to obtain N encoded bits;
   obtaining a first puncturing sequence based on an information bit length N1, the quantity N of the encoded bits, and a quantity Q of to-be-punctured bits; and
   performing a puncturing operation on the N encoded bits based on the first puncturing sequence to implement a rate matching.

2. The rate matching method according to claim 1, wherein the determining of the N to-be-encoded bits comprises:
   determining N based on M, wherein $N=2^{\lfloor log_2(M-1) \rfloor+1}$, the symbol $\lfloor \rfloor$ represents a rounding-down operation, M is an output target code length of a polar code, M is not equal to a positive integer power of 2, M is a positive integer, and the quantity of to-be-punctured bits is Q=N−M.

3. The rate matching method according to claim 1, wherein the obtaining of the first puncturing sequence based on the information bit length N1, the quantity N of the encoded bits, and the quantity Q of the to-be-punctured bits comprises:
   obtaining a second puncturing sequence corresponding to the information bit length N1 and the quantity N of the encoded bits, wherein a length of the second puncturing sequence is (N/2)−1; and
   determining the first puncturing sequence from the second puncturing sequence based on the quantity Q of the to-be-punctured bits.

4. The rate matching method according to claim 3, wherein the determining of the first puncturing sequence from the second puncturing sequence based on the quantity Q of the to-be-punctured bits comprises:
   determining a sequence comprising the first Q to-be-punctured bits in the second puncturing sequence, as the first puncturing sequence.

5. The rate matching method according to claim 1, wherein the obtaining of the first puncturing sequence based on the information bit length N1, the quantity N of the encoded bits, and the quantity Q of the to-be-punctured bits comprises:

obtaining a third puncturing sequence corresponding to the information bit length N1 and a maximum mother code length, wherein the maximum mother code length is a mother code length corresponding to a maximum target code length supported by a communications system to which the polar code is applied; and determining the first puncturing sequence from the third puncturing sequence based on the quantity N of the encoded bits and the quantity Q of the to-be-punctured bits.

6. The rate matching method according to claim 5, wherein the determining of the first puncturing sequence from the third puncturing sequence based on the quantity N of the encoded bits and the quantity Q of the to-be-punctured bits comprises:

successively reading, starting from a first to-be-punctured bit in the third puncturing sequence, to-be-punctured bits that are not greater than N; and when a quantity of to-be-punctured bits that are read reaches the quantity Q of the to-be-punctured bits, determining a sequence comprising the Q to-be-punctured bits that are read as the first puncturing sequence.

7. The rate matching method according to claim 1, wherein the obtaining of the first puncturing sequence based on the information bit length N1, the quantity N of the encoded bits, and the quantity Q of the to-be-punctured bits comprises:

determining a first to-be-punctured bit from the N encoded bits based on the N1 information bits;

separately determining, by traversing i values from 2 to the quantity Q of the to-be-punctured bits, the $i^{th}$ to-be-punctured bit from (N−i+1) encoded bits remaining after (i−1) determined to-be-punctured bits are excluded from the N encoded bits, wherein 2≤i≤Q; and using a sequence comprising the Q determined to-be-punctured bits as the first puncturing sequence.

8. The rate matching method according to claim 7, wherein the determining of the first to-be-punctured bit from the N encoded bits based on the N1 information bits comprises:

when each of the N encoded bits is used as a to-be-punctured bit, separately calculating an error probability of polarized channels corresponding to the N1 information bits; and determining a minimum error probability from the calculated N error probabilities, and determining an encoded bit corresponding to the minimum error probability as the first to-be-punctured bit.

9. The rate matching method according to claim 7, wherein the determining of the $i^{th}$ to-be-punctured bit from (N−i+1) encoded bits remaining after the (i−1) determined to-be-punctured bits are excluded from the N encoded bits comprises:

when each of the (N−i+1) encoded bits is used as a to-be-punctured bit, separately calculating an error probability of polarized channels corresponding to the N1 information bits; and determining a minimum error probability from the calculated (N−i+1) error probabilities, and determining an encoded bit corresponding to the minimum error probability as the $i^{th}$ to-be-punctured bit.

10. The method according to claim 8, wherein the calculating of an error probability of polarized channels corresponding to the N1 information bits comprises:

adding up error probabilities of the polarized channels corresponding to all of the N1 information bits to obtain the error probability of the polarized channels corresponding to the N1 information bits.

11. A polar code rate matching apparatus, comprising:

a determining module, configured to determine N to-be-encoded bits, wherein the N to-be-encoded bits comprise N1 information bits, and both N1 and N are positive integers;

an encoding module, configured to encode the N to-be-encoded bits to obtain N encoded bits;

a first-puncturing-sequence obtaining module, configured to obtain a first puncturing sequence based on an information bit length N1, the quantity N of the encoded bits, and a quantity Q of to-be-punctured bits; and a puncturing module, configured to perform a puncturing operation on the N encoded bits based on the first puncturing sequence to implement a rate matching.

12. The rate matching apparatus according to claim 11, wherein the determining module is configured to:

determine N based on M, wherein $N=2^{\lfloor \log_2(M-1) \rfloor+1}$, the symbol ⌊ ⌋ represents a rounding-down operation, M is an output target code length of a polar code, M is not equal to a positive integer power of 2, M is a positive integer, and the quantity of the to-be-punctured bits is Q=N−M.

13. The rate matching apparatus according to claim 11, wherein the first-puncturing-sequence obtaining module comprises:

a second-puncturing-sequence obtaining module, configured to obtain a second puncturing sequence corresponding to the information bit length N1 and the quantity N of the encoded bits, wherein a length of the second puncturing sequence is (N/2)−1; and a first-puncturing-sequence determining module, configured to determine the first puncturing sequence from the second puncturing sequence based on the quantity Q of the to-be-punctured bits.

14. The rate matching apparatus according to claim 11, wherein the first-puncturing-sequence determining module is configured to:

determine a sequence comprising the first Q to-be-punctured bits in the second puncturing sequence, as the first puncturing sequence.

15. The rate matching apparatus according to claim 11, wherein the first-puncturing-sequence obtaining module comprises:

a third-puncturing-sequence obtaining module, configured to obtain a third puncturing sequence corresponding to the information bit length N1 and a maximum mother code length, wherein the maximum mother code length is a mother code length corresponding to a maximum target code length supported by a communications system to which the polar code is applied; and a first-puncturing-sequence determining module, configured to determine the first puncturing sequence from the third puncturing sequence based on the quantity N of the encoded bits and the quantity Q of the to-be-punctured bits.

16. The rate matching apparatus according to claim 15, wherein the first-puncturing-sequence determining module is configured to:

successively read, starting from a first to-be-punctured bit in the third puncturing sequence, to-be-punctured bits that are not greater than N; and when a quantity of to-be-punctured bits that are reaches the quantity Q of the to-be-punctured bits, determine a sequence comprising the Q to-be-punctured bits that are read as the first puncturing sequence.

17. The rate matching apparatus according to claim 11, wherein the first-puncturing-sequence obtaining module is configured to:
   determine a first to-be-punctured bit from the N encoded bits based on the N1 information bits;
   separately determine, by traversing i values from 2 to the quantity Q of to-be-punctured bits, the $i^{th}$ to-be-punctured bit from (N−i+1) encoded bits remaining after (i−1) determined to-be-punctured bits are excluded from the N encoded bits, wherein 2≤i≤Q; and
   use a sequence comprising the Q determined to-be-punctured bits as the first puncturing sequence.

18. A communications apparatus, comprising:
   a memory, configured to store a program; and
   a processor, configured to execute the program stored in the memory, wherein when the program is executed, the processor is configured to:
   determine N to-be-encoded bits, wherein the N to-be-encoded bits comprise N1 information bits, and both N1 and N are positive integers;
   encode the N to-be-encoded bits to obtain N encoded bits;
   obtain a first puncturing sequence based on an information bit length N1, the quantity N of the encoded bits, and a quantity Q of to-be-punctured bits; and
   puncture on the N encoded bits based on the first puncturing sequence to implement a rate matching.

19. A computer-readable storage medium, comprising an instruction, wherein when the instruction runs on a computer, the computer is configured to:
   determine N to-be-encoded bits, wherein the N to-be-encoded bits comprise N1 information bits, and both N1 and N are positive integers;
   encode the N to-be-encoded bits to obtain N encoded bits;
   obtain a first puncturing sequence based on an information bit length N1, the quantity N of the encoded bits, and a quantity Q of to-be-punctured bits; and
   puncture on the N encoded bits based on the first puncturing sequence to implement a rate matching.

* * * * *